US007632541B2

(12) United States Patent
Saylor et al.

(10) Patent No.: US 7,632,541 B2

(45) Date of Patent: Dec. 15, 2009

(54) METHOD AND DEVICE TO PREVENT COATING A DOVETAIL OF A TURBINE AIRFOIL

(75) Inventors: Matthew David Saylor, Blanchester, OH (US); Jackie Lee King, Franklin, OH (US)

(73) Assignee: General Electric Company, Schenectady, NY (US)

( * ) Notice: Subject to any disclaimer, the term of this patent is extended or adjusted under 35 U.S.C. 154(b) by 423 days.

(21) Appl. No.: 11/276,745

(22) Filed: Mar. 13, 2006

(65) Prior Publication Data

US 2009/0252872 A1 Oct. 8, 2009

(51) Int. Cl.
*C23C 16/00* (2006.01)

(52) U.S. Cl. .................................... 427/248.1; 427/250

(58) Field of Classification Search ............. 427/248.1, 427/250

See application file for complete search history.

(56) References Cited

U.S. PATENT DOCUMENTS 6,616,969 B2 9/2003 Pfaendtner et al.
6,695,587 B2 2/2004 Wustman et al.
6,821,564 B2 11/2004 Das et al.
6,863,927 B2 * 3/2005 Langley et al. .............. 427/252
2005/0227589 A1 * 10/2005 Oussaada et al. .............. 451/29

* cited by examiner

*Primary Examiner*—Roberts Culbert
(74) *Attorney, Agent, or Firm*—William Scott Andes; Gary M. Hartman; Domenica N. S. Hartman

(57) ABSTRACT

A method and masking assembly for masking a dovetail portion of a turbine blade during coating of an airfoil portion of the blade. The masking assembly comprises at least two masking members, each having an exterior surface and an oppositely-disposed undulatory surface complementary to one of oppositely-disposed undulatory surfaces of the dovetail portion. By mating the masking members, the undulatory surfaces thereof define an interior cavity within the masking assembly that accommodates the dovetail portion, and the undulatory surfaces of the masking members contact the undulatory surfaces of the dovetail portion to entrap the dovetail portion within the interior cavity of the masking assembly.

10 Claims, 3 Drawing Sheets

METHOD AND DEVICE TO PREVENT COATING A DOVETAIL OF A TURBINE AIRFOIL

BACKGROUND OF THE INVENTION

The present invention generally relates to coating deposition processes and equipment. More particularly, this invention relates to a method and masking assembly for selectively depositing a coating on a turbine airfoil while preventing deposition of the coating on a dovetail of the airfoil.

Components of gas turbine engines, such as the blades and vanes (nozzles) of the turbine section within a gas turbine engine, are often formed of an iron, nickel, or cobalt-base superalloy. A turbine blade has an airfoil against which hot combustion gases are directed during operation of the gas turbine engine, and whose surface is therefore subjected to severe attack by oxidation, corrosion and erosion. The blade further includes a root section separated from the airfoil by a platform. Turbine blades are commonly anchored to the perimeter of a rotor or wheel by forming the rotor to have slots with dovetail cross-sections, and forming the root section of each blade to have a complementary dovetail profile whose oppositely-disposed undulatory surfaces, generally characterized by alternating lobes and recesses, interlock with the dovetail slot of the rotor.

Due to the severity of their operating environments, turbine blades often require environmentally protective coatings on the surfaces of their airfoils and platforms exposed to the hot gas path. Diffusion coatings such as chromide, aluminide, and platinum aluminide coatings are widely used as environmental coatings in gas turbine engine applications because of their oxidation resistance. Such coatings, which are typically applied to the internal and external surfaces of a blade, are produced by a thermal/chemical reaction process that takes place in a reduced and/or inert atmosphere at a specified temperature. Common processes include pack cementation and noncontact vapor (gas phase deposition) techniques, and typically take place at processing temperatures of about a 1900° F. (about 1040° C.) or more. The dovetail of a turbine blade is typically machined prior to the diffusion coating process, and is not coated during coating of the airfoil so that the dovetail will properly assemble with the dovetail slot in the rotor during engine build.

Slurries, putties, and tapes have been widely used as masks to prevent coating deposition on the machined surfaces of blade dovetails. One approach is to cover the dovetail surfaces with a mask formed from a slurry paste, such as a mixture of nickel powders and an organic binder. The slurry paste may be applied with pneumatic injection equipment and then dried to form a solid mask. Alternatively, the blade dovetails can be dipped into the masking slurry, with multiple dips typically being required to form an effective mask with sufficient thickness. The masked dovetails are then often wrapped in a metal foil to contain the maskant during the coating process. With either approach, the solid mask must be mechanically removed after the coating process, such as by grit blasting, rotating wire brush, etc. To avoid the requirement of removing a solid maskant, the dovetail can simply be buried in a nickel powder without any binder, so that the powder forms a loose maskant that covers the dovetail during the coating operation. Still another alternative is to cast the slurry into thin film tapes that can be individually applied to the blade. While this approach is well suited for masking localized areas, tapes are not typically used as a primary method for masking the undulatory machined surfaces of a dovetail.

Significant shortcomings associated with the above-noted approaches include the preparation, application, and removal of the masking materials, which can be labor intensive and require the services of a skilled individual. As such, alternative masking techniques have been proposed. On such approach is taught in commonly-assigned U.S. Pat. Nos. 6,224,673, 6,579,567, and 6,821,564 to Das et al. These patents teach the use of a reusable fixture to enclose those portions of an article, such as a gas turbine blade, on which a coating is not desired. The fixture has an internal cavity and at least one aperture whose cross-section is substantially the same as a cross-section of the article to be coated. In the case of a blade, the aperture is sized to enable the entire dovetail of the blade to be inserted through the aperture into the internal cavity of the fixture, so that the platform seals against the exterior of the fixture. The fixture may include a holder to stabilize the dovetail within the internal cavity.

While the teachings of Das et al. overcome the shortcomings associated with the use of masking tapes, slurries, and other types of coatings, further improvements would still be desirable.

BRIEF SUMMARY OF THE INVENTION

The present invention provides a method and masking assembly for masking a dovetail portion of a turbine blade during coating of an airfoil portion of the blade. The masking assembly comprises at least two masking members, each having an exterior surface and an oppositely-disposed undulatory surface complementary to one of oppositely-disposed undulatory surfaces of the dovetail portion. By mating the masking members, the undulatory surfaces thereof define an interior cavity within the masking assembly that accommodates the dovetail portion, and the undulatory surfaces of the masking members contact the undulatory surfaces of the dovetail portion to entrap the dovetail portion within the interior cavity of the masking assembly.

The method of this invention generally entails placing the dovetail portion in the masking assembly so that the airfoil portion of the blade remains outside the masking assembly, the interior cavity of the masking assembly accommodates the dovetail portion, and the undulatory surfaces of the masking members contact the undulatory surfaces of the dovetail portion and entrap the dovetail portion within the interior cavity. A coating vapor is then supplied to deposit a coating on the airfoil portion of the blade while preventing deposition of coating on the dovetail portion with the masking assembly. Following coating deposition, the masking members are separated to release the blade from the masking assembly.

In view of the above, the present invention provides a simplified method for masking the dovetail portion of a turbine blade, without the requirement for masking the dovetail portion with a masking slurry or tapes as conventionally done in the past. As such, the present invention eliminates the labor required to prepare and apply a masking slurry over the entire dovetail portion, and avoids the additional labor required to mechanically remove a solidified mask formed by the masking slurry at the conclusion of the coating operation. As a result, both the masking assembly and method made possibly with the masking assembly are considerably less complicated than prior art masking methods, yet achieves the object of preventing coating of the dovetail portion of a turbine blade.

Other objects and advantages of this invention will be better appreciated from the following detailed description.

DETAILED DESCRIPTION OF THE INVENTION

The present invention provides a method for preventing the deposition of a coating on surfaces of the dovetail portion of a gas turbine engine blade, particularly a turbine blade. While the advantages of this invention will be illustrated and described with reference to a turbine blade on which an environmental coating is to be deposited to protect the blade from its hostile operating environment, the teachings of this invention are generally applicable to other components having surfaces and on which a coating and still other surfaces on which a coating is not desired.

Figure 1:
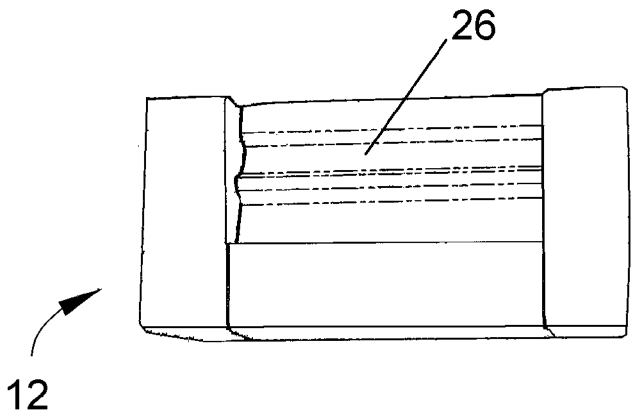
FIG. 1 is a perspective view of a masking member in accordance with a preferred embodiment of this invention.
Figure 2:
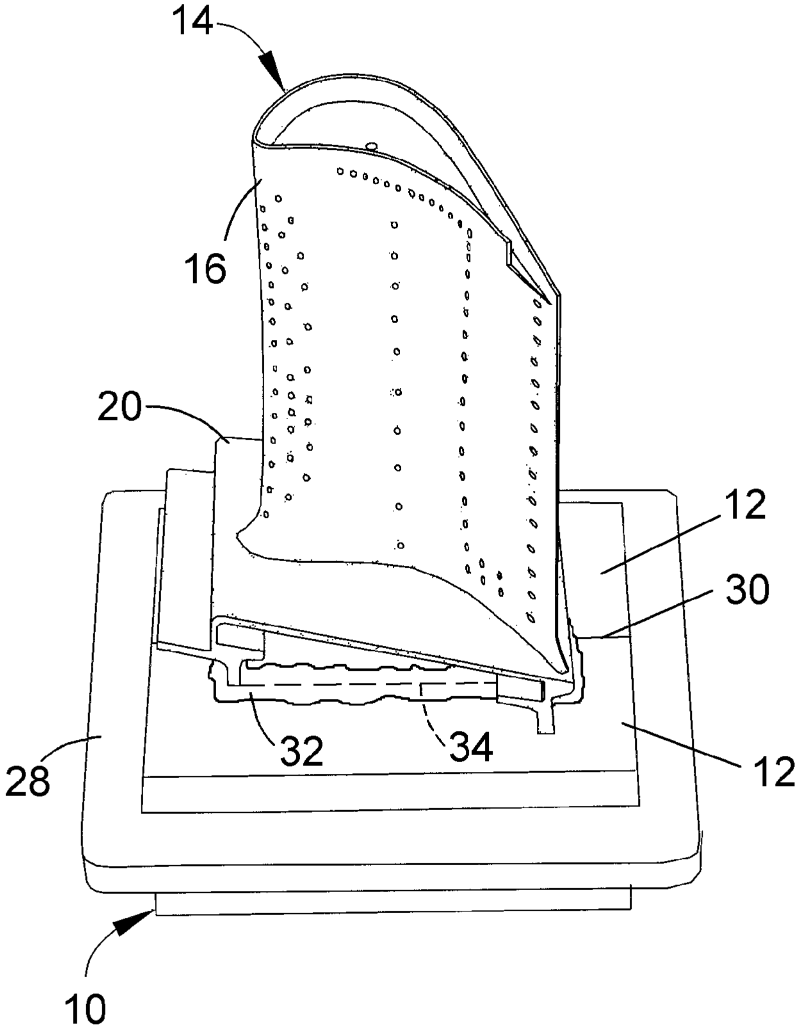
FIG. 2 is a perspective view of a turbine blade installed in a masking assembly formed by mating two masking members of the type shown in FIG. 1, such that a dovetail portion of the blade is enclosed within the masking assembly and an airfoil portion of the blade is exposed outside the masking assembly.
Figure 3:
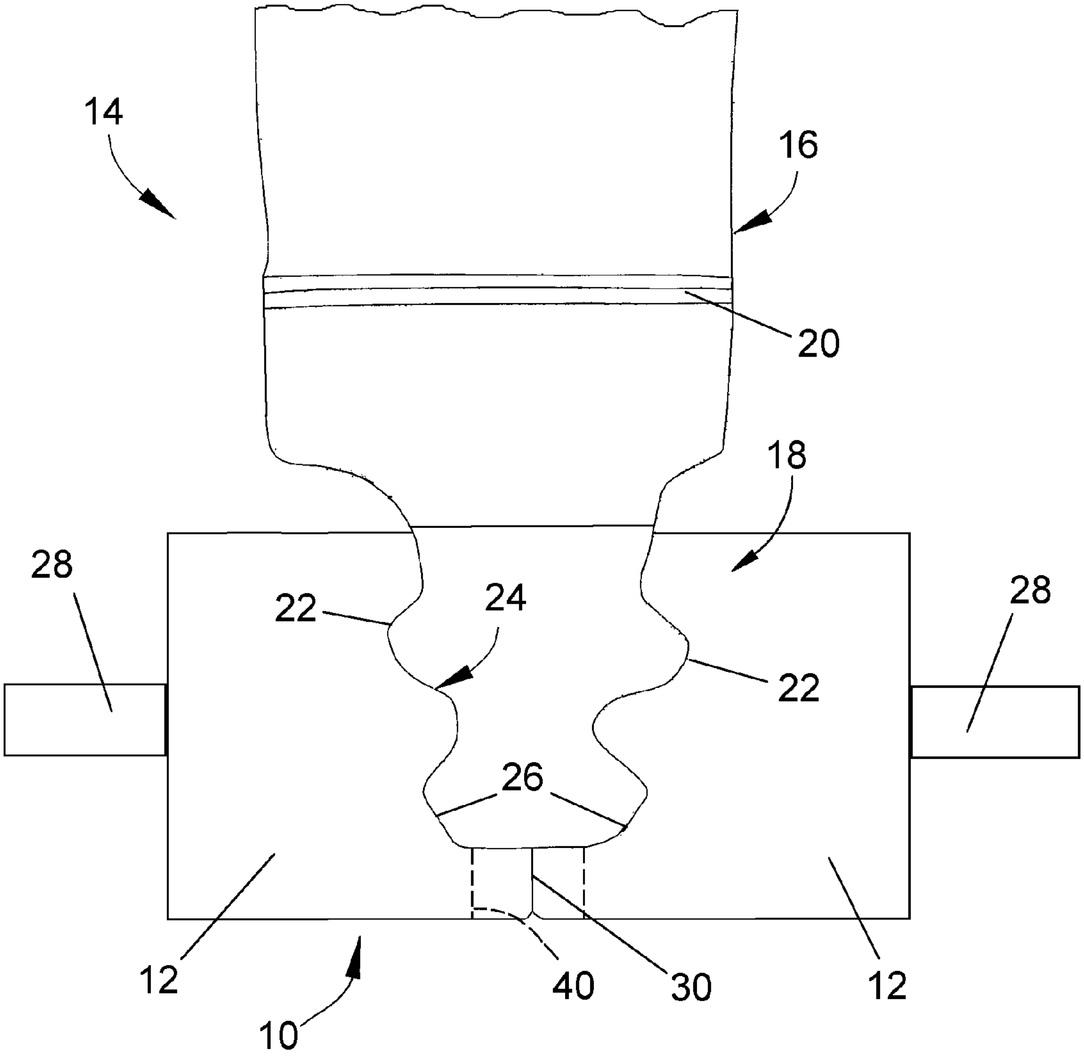
FIG. 3 is a cross-sectional view through the masking assembly of FIG. 2.

FIGS. 1 through 3 depict a masking shell 12 and a turbine blade 14 installed in a masking assembly 10 formed by mating the masking shell 12 with a second and essentially identical masking shell 12, resulting in the assembly 10 having a clam shell-like construction. Blades of the type represented in the Figures are typically formed of an iron, nickel, or cobalt-base superalloy, though the use of other materials is within the scope of this invention. The blade 14 includes an airfoil 16 against which hot combustion gases are directed during operation of the gas turbine engine, and whose surfaces are therefore subjected to severe attack by oxidation, corrosion and erosion. The blade 14 is configured to be anchored to a turbine disk (not shown) with a dovetail 18 formed on a root section of the blade 14. A platform 20 is between the airfoil 16 and dovetail 18. The dovetail 18 has opposing surfaces 22 that may be termed undulatory, wavy, etc., in other words, generally characterized by alternating lobes and recesses. As is known in the art, the dovetail surfaces 22 are complementary to surfaces of a slot formed in the disk into which the dovetail 18 will be inserted to interlock the blade 14 with the disk.

The airfoil 16 is intended to be protected from the hostile environment of the turbine section by an environmentally-resistant coating, for example, a diffusion coating such as a chromide, aluminide, or platinum aluminide coating. As is understood in the art, these types of coatings are formed by such processes as pack cementation or noncontact vapor (gas phase deposition) techniques, in which a vapor of a desired coating element (e.g., chromium, aluminum, etc.) is generated and caused to contact the surfaces of the blade 14 on which the coating is desired. The vapor reacts with the surface to deposit the desired coating element(s), which are then diffused into the surface. Such processes are well known to those skilled in the art, and therefore will not be discussed in further detail here.

As noted above, the present invention is intended to prevent deposition of the coating on surfaces of the dovetail 18, particularly its undulatory surfaces 22 that are required to subsequently mate with the dovetail slot in a rotor. For this purpose, most of the dovetail 18 is shown in FIGS. 2 and 3 as being enclosed within an interior cavity 24 formed by mating the masking shells 12 to yield the masking assembly 10. The cavity 24 is defined by opposing interior surfaces 26 of the masking shells 12. As evident from FIG. 3, the interior surfaces 26 of the masking shells 12 are complementary to the undulatory surfaces 22 of the dovetail 18, so that the surfaces 26 of the shells 12 contact and interlock with the dovetail surfaces 22 to secure and essentially immobilize the dovetail 18 within the masking assembly 10. While the surfaces 26 of the masking shells 12 are represented as having a close and continuous surface-to-surface fit with the surfaces 22 of the dovetail 18, it is foreseeable that the benefits of the invention could be realized without such a continuous surface-to-surface fit, as long as sufficient contact exists to interlock and secure the dovetail 18 to the masking assembly 10.

FIG. 3 shows the masking assembly 10 as including an optional passage 40 through which coating vapors can enter the interior of the blade 10 to enable deposition of the coating on any internal cooling passages within the blade 10. If necessary, a maskant material (not shown) of a type used in the prior art as described previously, such as a tape, putty, or slurry, can be applied to mask any exterior surfaces of the dovetail 18 exposed by the passage 40 in the masking assembly 10.

The masking assembly 10 is also represented in FIGS. 2 and 3 as further having a retaining ring 28 to secure the masking shells 12 together. The ring 28 preferably forces the mating surfaces of the shells 12 together with sufficient force to close the split line 30 between the shells 12 and prevent entrance of the coating vapors into the cavity 24. For this purpose, the retaining ring 28 preferably has a draft angle machined into its surface contacting the masking shells 12 to ease its installation and removal from the masking assembly 10 while locking the ring 28 in place. FIG. 2 further shows a sealing material 32 deposited along the interfaces 34 between the masking shells 12 and the blade 14 to further inhibit coating penetration. The sealing material 32 may be, for example, a maskant material of a type used in the prior art as described previously, such as a tape, putty, or bead of slurry.

Suitable materials for the masking shells 12 and retaining ring 28 include metallic and ceramic materials. In practice, the nickel-base superalloy commercially known as Inconel 600 has been shown to be a durable and reusable material for both the shells 12 and ring 28, though it is foreseeable that other materials could be used. The surfaces of the masking shells 12 and ring 28 that contact other components of the assembly 10 or the blade 14 are preferably machined to ensure an appropriate fit.

Figure 4:
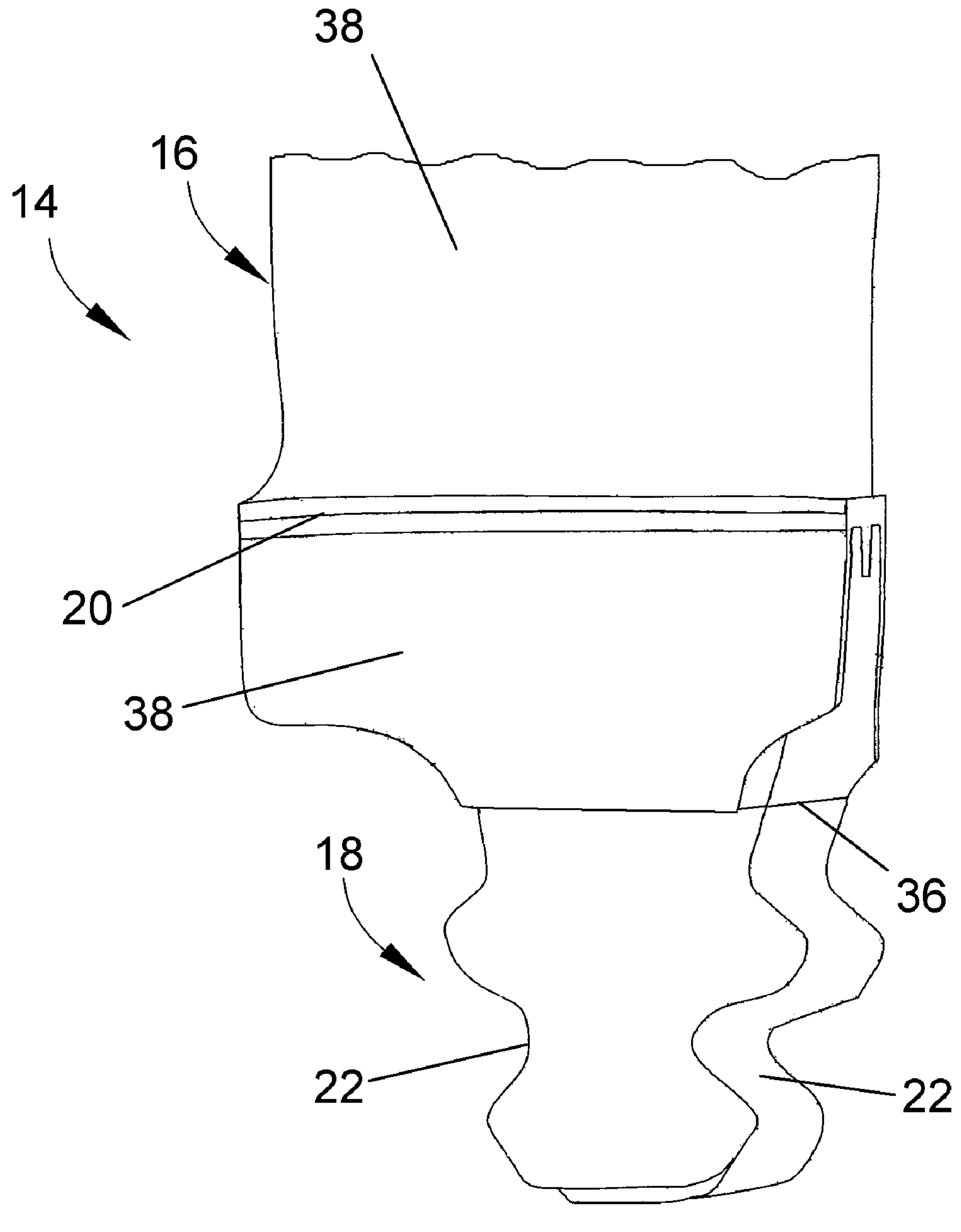
FIG. 4 represents the blade of FIGS. 2 and 3 after removal from the masking assembly.

In view of the above, masking of the dovetail 18 with the masking assembly 10 simply involves placing the dovetail 18 in the assembly 10 by mating the masking shells 12 so that the undulatory surfaces 26 of the shells 12 contact and entrap the dovetail 18 within the interior cavity 24 of the masking assembly 10. After installing the retaining ring 28, the entire blade and masking assembly can then be placed in a suitable coating apparatus (not shown) and ran through a coating cycle as required by the particular coating material and coating process being employed. Once the coating cycle is complete, the retaining ring 28 is removed and the masking shells 12 separated to release the blade 14. Reuse of the masking shells 12 and retaining ring 28 may generally involve removing the sealing material 32 and any residual coating material from the exterior surfaces of the assembly 10. The blade 14 is represented in FIG. 4 as having been removed from the assembly 10, and as having a coating 38 on only the surfaces of the airfoil 16 and platform 20 and limited surface portions of the dovetail 18 exposed to the coating vapor, with the dovetail 18 being free of coating below a coating boundary 36 corresponding to the uppermost extent of the masking assembly 10 on the blade 14. From the location of the coating boundary 36, it is evident that the masking assembly 10 of this invention enables the entire platform 20, including its upper and lower surfaces, to be coated for oxidation and corrosion protection.

While the invention has been described in terms of a preferred embodiment, it is apparent that other forms could be adopted by one skilled in the art. For example, the physical configuration of the masking assembly 10, shells 12, blade 14, and ring 28 could differ from that shown. Therefore, the scope of the invention is to be limited only by the following claims.

The invention claimed is:

1. A method of masking a dovetail portion of a turbine blade during coating of an airfoil portion of the blade and a platform of the blade between the airfoil and dovetail portions, the method comprising the steps of:

placing the dovetail portion in a solid masking assembly so that the airfoil portion and the entire platform of the blade remain outside the masking assembly, the masking assembly comprising at least two masking members, each masking member having an exterior surface and an oppositely-disposed undulatory surface complementary to one of oppositely-disposed undulatory surfaces of the dovetail portion, the dovetail portion being placed in the masking assembly by mating the masking members so that the undulatory surfaces thereof define an interior cavity within the masking assembly that accommodates at least part of the dovetail portion and the undulatory surfaces of the masking members contact the undulatory surfaces of the dovetail portion, the undulatory surfaces of the masking members entrapping the dovetail portion within the interior cavity of the masking assembly while the masking members remain mated;

supplying a coating vapor to deposit a coating on the airfoil portion and on the entire platform of the blade while preventing deposition of coating on the dovetail portion with the masking assembly; and then separating the masking members to release the blade from the masking assembly.

2. The method according to claim 1, wherein the masking members are formed to be substantially identical.

3. The method according to claim 1, further comprising securing the masking members together with a retaining ring after placing the dovetail portion in the masking assembly.

4. The method according to claim 1, further comprising applying a sealant to interfaces defined by and between the masking members and by and between the dovetail portion and the masking members to prevent the coating vapor from entering the interior cavity of the masking assembly.

5. The method according to claim 4, wherein the sealant is a masking tape, putty, or slurry.

6. The method according to claim 1, wherein the masking members are formed of a material chosen from the group consisting of metallic and ceramic materials.

7. The method according to claim 1, wherein the masking members are formed of a nickel-base superalloy.

8. The method according to claim 1, further comprising reusing the masking assembly to deposit a coating on an airfoil portion of a second blade while preventing deposition of coating on a dovetail portion of the second blade with the masking assembly.

9. A method of masking a dovetail portion of a turbine blade during coating of an airfoil portion of the blade, the method comprising the steps of:

placing the dovetail portion in a solid masking assembly so that the airfoil portion of the blade remains outside the masking assembly, the masking assembly comprising at least two masking members, each masking member having an exterior surface and an oppositely-disposed undulatory surface complementary to one of oppositely-disposed undulatory surfaces of the dovetail portion, the dovetail portion being placed in the masking assembly by mating the masking members so that the undulatory surfaces thereof define an interior cavity within the masking assembly that accommodates at least part of the dovetail portion and the undulatory surfaces of the masking members contact the undulatory surfaces of the dovetail portion, the undulatory surfaces of the masking members entrapping the dovetail portion within the interior cavity of the masking assembly while the masking members remain mated;

supplying a coating vapor to deposit a coating on the airfoil portion of the blade while preventing deposition of coating on the dovetail portion with the masking assembly; and then separating the masking members to release the blade from the masking assembly;

wherein the blade further comprises an internal cooling passage and the masking assembly has a passage therein through which the coating vapor enters the internal cooling passage during the supplying step.

10. The method according to claim 9, wherein the blade further comprises a platform between the airfoil and dovetail portions, and the placing step results in the entire platform being exposed during the step of supplying the coating vapor so that the coating is also deposited on the platform in its entirety.

* * * * *

UNITED STATES PATENT AND TRADEMARK OFFICE

CERTIFICATE OF CORRECTION

PATENT NO. : 7,632,541 B2
APPLICATION NO. : 11/276745
DATED : December 15, 2009
INVENTOR(S) : Saylor et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 700 days.

Signed and Sealed this

Second Day of November, 2010

David J. Kappos

*Director of the United States Patent and Trademark Office*